United States Patent
Lin et al.

(10) Patent No.: US 10,432,110 B2
(45) Date of Patent: *Oct. 1, 2019

(54) POWER CONVERTER HAVING RESONANT FREQUENCIES AROUND TWO AND FOUR TIMES THE SWITCHING FREQUENCY

(71) Applicant: TDK CORPORATION, Tokyo (JP)

(72) Inventors: Min Lin, Tokyo (JP); Ken Matsuura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/012,099

(22) Filed: Jun. 19, 2018

(65) Prior Publication Data

US 2018/0375441 A1 Dec. 27, 2018

(30) Foreign Application Priority Data

Jun. 22, 2017 (JP) .................................. 2017-121883

(51) Int. Cl.
| | | |
|---|---|---|
| H02M 7/523 | (2006.01) | |
| H03F 3/217 | (2006.01) | |
| H02M 7/48 | (2007.01) | |

(52) U.S. Cl.
CPC ......... *H02M 7/523* (2013.01); *H02M 7/4826* (2013.01); *H03F 3/2176* (2013.01); *H02M 2007/4815* (2013.01)

(58) Field of Classification Search
CPC ........ H03F 3/2176; H02M 2007/4818; H02M 2007/4815; H02M 7/523; H02M 7/5383
See application file for complete search history.

(56) References Cited

U.S. PATENT DOCUMENTS

| | | | |
|---|---|---|---|
| 3,919,656 A | 11/1975 | Sokal et al. | |
| 5,535,438 A * | 7/1996 | Sevic | .................... H03F 3/2176 330/207 A |
| 7,889,519 B2 | 2/2011 | Perreault et al. | |
| 2016/0181987 A1 * | 6/2016 | Perreault | ............... H03F 3/2176 330/251 |
| 2018/0145608 A1 * | 5/2018 | Lin | ..................... H02M 7/4826 |

* cited by examiner

*Primary Examiner* — Harry R Behm
(74) *Attorney, Agent, or Firm* — Greenblum & Bernstein, P.L.C.

(57) ABSTRACT

A power converter includes: input terminals for inputting a DC voltage; output terminals for outputting an AC voltage; a switch; a first resonant capacitance connected between both ends of the switch; a first LC resonance circuit connected in series with the switch between the output terminals; and a second LC resonance circuit connected between the input terminals and the switch. The first LC resonance circuit includes an inductance and a capacitance in series. When the input terminals are shorted, frequency characteristics of an impedance of the second LC resonance circuit include first to fourth resonant frequencies. The first resonant frequency is higher than a switching frequency of the switch. The second and fourth resonant frequencies are around double and four times the switching frequency. The impedance has local maxima at the first and third resonant frequencies and local minima at the second and fourth resonant frequencies.

9 Claims, 5 Drawing Sheets

POWER CONVERTER HAVING RESONANT FREQUENCIES AROUND TWO AND FOUR TIMES THE SWITCHING FREQUENCY

FIELD OF THE INVENTION

The present invention relates to a power converter.

DESCRIPTION OF THE RELATED ART

A resonant inverter and a resonant converter circuit that have high conversion efficiency are well-known examples of an RF power amplifier and power conversion circuit that operate in a high frequency band (see Patent Literature 1 (U.S. Pat. No. 3,919,656) and Patent Literature 2 (U.S. Pat. No. 7,889,519)).

Figure 10:
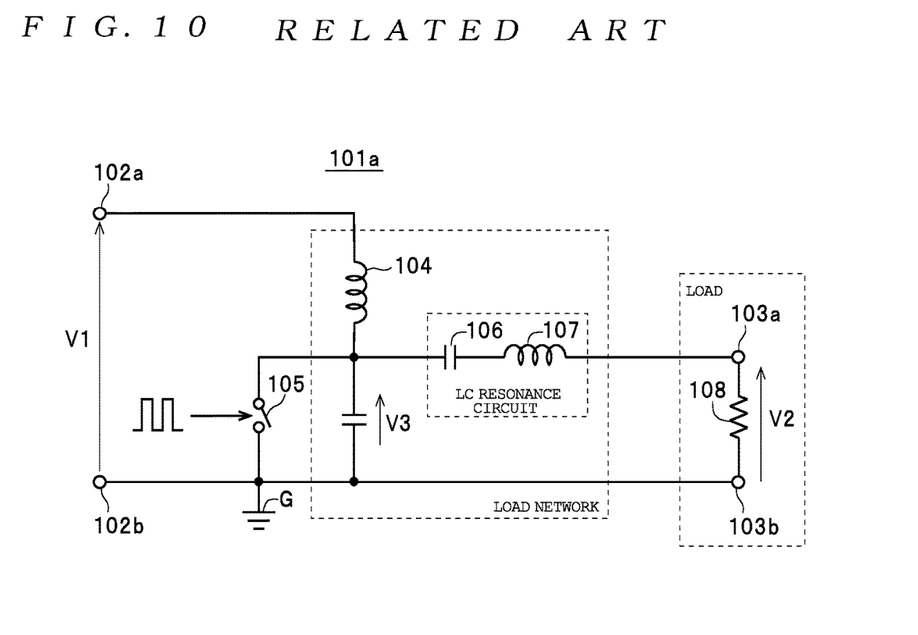
FIG. 10 is a diagram schematically depicting the circuit configuration of a resonant inverter 101a in Patent Literature 1.

As depicted in FIG. 10, Patent Literature 1 discloses a resonant inverter 101a technology which is constructed by a single-ended switching element 105 and a load network, which converts a direct current (DC) input voltage V1 inputted across DC input terminals 102a and 102b to an alternating current (AC) output voltage V2, and which is outputted from output terminals 103a and 103b to a load resistance 108. The load network includes an inductor 104 as a standalone component connected between the high-potential-side DC input terminal 102a (out of the DC input terminals 102a and 102b) and one end of the switching element 105, a capacitance connected across both ends of the switching element 105, and an LC resonance circuit (a series circuit composed of a capacitance 106 and an inductance 107) connected between the output terminal 103a out of the output terminals 103a and 103b and the one end of the switching element 105. The other end of the switching element 105, the low-potential-side direct current input terminal 102b, and the output terminal 103b are connected to a common ground G. In this resonant inverter 101a, the voltage V3 of the switching element 105 is decided by the response characteristics of the load network connected to the switching element 105. During a period where the switching element 105 is off, the voltage V3 applied across both ends of the switching element 105 gradually rises immediately after the switching element 105 is turned off and the voltage value and the rate of change in the voltage with respect to time also become around zero immediately before the switching element 105 turns on.

Therefore, in the resonant inverter 101a according to Patent Literature 1, since switching of the switching element 105 causes no discharge loss for the energy accumulated in the capacitance connected across both ends of the switching element 105, a high-frequency switching operation is possible. Due to this advantage, the resonant inverter 101a in Patent Literature 1 is widely used as an RF power amplifier of a communication system and as a high-frequency switching power supply that has a rectifying and smoothing circuit attached downstream. However, with the resonant inverter 101a according to Patent Literature 1, the voltage peak value applied across both ends of the switching element 105 during the period where the switching element 105 is off rises due to voltage resonance to around 3.6 times the DC input voltage V1.

Figure 11:
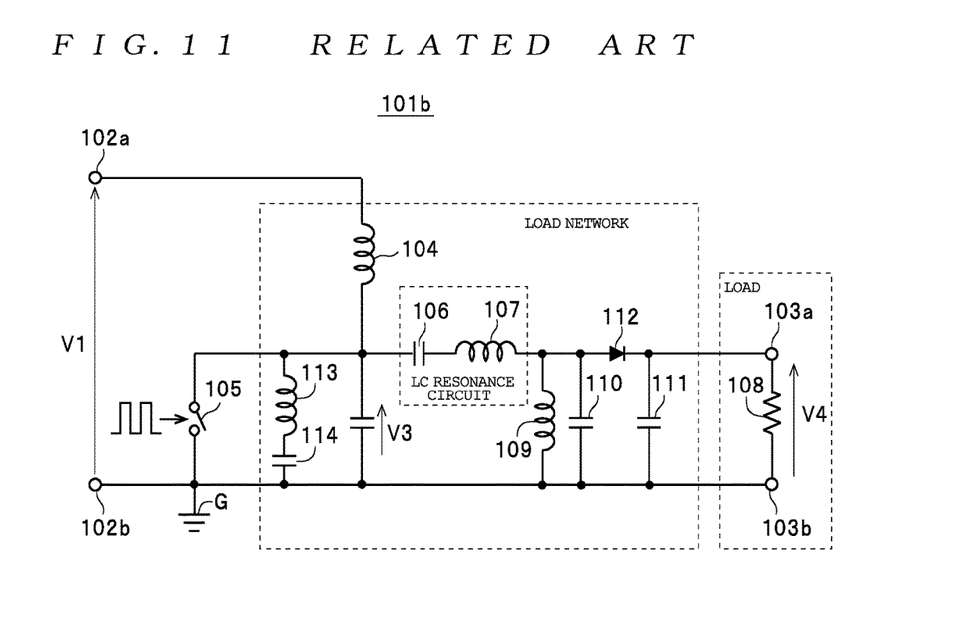
FIG. 11 is a diagram schematically depicting the circuit configuration of a resonant converter 101b in Patent Literature 2.

On the other hand, as depicted in FIG. 11, Patent Literature 2 discloses a resonant converter 101b technology that retains the inverter characteristics of Patent Literature 1 but makes it possible to suppress the voltage peak value applied across both ends of the switching element 105 to around double the DC input voltage V1 by attaching an LC resonant circuit (a series circuit composed of an inductance 113 and a capacitance 114) that suppresses a second harmonic component of the switching frequency to both ends of the switching element 105. In addition to the construction of the load network of the resonant inverter 101a described above, the load network of the resonant converter 101b includes, together with the inductance 113 and the capacitance 114 described above, an AC-to-DC converter circuit (an LC resonance circuit constructed of an inductance 109 and a capacitance 110 connected in parallel, and a rectifying and smoothing circuit composed of a capacitance 111 and a diode 112 which includes a junction capacitance) disposed between the LC resonance circuit (a series circuit composed of the capacitance 106 and the inductance 107) of the resonant inverter 101a and the output terminals 103a and 103b. The DC input voltage V1 inputted across the DC input terminals 102a and 102b is converted to the DC output voltage V4, which is outputted from the output terminals 103a and 103b to the load resistor 108. Note that configurations that are the same as the resonant inverter 101a have been assigned the same reference numerals and duplicated description thereof is omitted. With the resonant converter 101b according to Patent Literature 2, in the same way as the resonant inverter 101a according to Patent Literature 1, high-frequency switching operations up to the RF band are possible.

Figure 12:
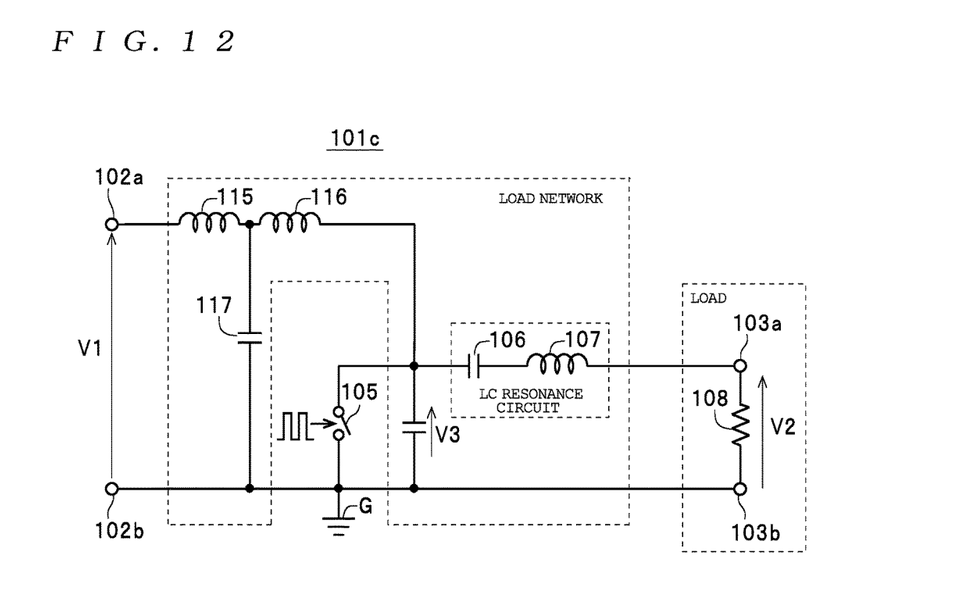
FIG. 12 is a diagram schematically depicting the circuit configuration of a resonant inverter 101c.

As depicted in FIG. 12, the present applicant has developed a resonant inverter 101c constructed by connecting, in place of the inductor 104 in the resonant inverter 101a described above, a T-shaped LC resonance circuit, which is composed of inductors 115 and 116 and a capacitance 117, between the DC input terminals 102a and 102b and both ends of the switching element 105. With this resonant inverter 101c also, since it is possible to suppress the second harmonic component of the switching frequency that is included in the voltage waveform generated across both ends of the switching element 105, it is possible to suppress the voltage peak value applied across both ends of the switching element 105 to around double the DC input voltage V1.

SUMMARY OF THE INVENTION

However, in recent years, there has been demand for even higher efficiency for power converter circuits like the resonant inverters 101a and 101c and the resonant converter 101b described above and for higher reliability for the switching element 105. To achieve higher efficiency, it is effective to further reduce the voltage peak value during voltage resonance that occurs across both ends of the switching element 105 so that it becomes possible to use a switching element with a lower on-resistance (switching elements with a low on-resistance typically have a low withstand voltage). Further reducing the voltage peak value in this way also reduce the voltage derating at the switching element 105, which is also advantageous in that it contributes to higher reliability for the switching element 105. However, there has been the problem that all of the technologies described above as background art have been insufficient in this regard.

The present invention was conceived in view of the problems described above and has an object of providing a power converter that has even higher efficiency and has improved reliability for a switch.

To achieve the stated object, a power converter according to the present invention comprises: two direct current (DC) input terminals that are plus and minus and into which a DC voltage is inputted; two alternating current (AC) output terminals that output an AC voltage; a switch with two ends; a first resonant capacitance connected between both ends of the switch; a first LC resonance circuit that is connected in series together with the switch between the AC output terminals; and a second LC resonance circuit that is connected between the two DC input terminals and both ends of the switch, wherein the first LC resonance circuit includes a current path including a series circuit composed of an inductance and a capacitance, and when looking from both ends of the switch when the two DC input terminals are shorted, frequency characteristics of an impedance of the second LC resonance circuit include, in order from a low-frequency side to a high-frequency side, a first resonant frequency, a second resonant frequency, a third resonant frequency, and a fourth resonant frequency, the first resonant frequency is higher than a switching frequency of the switch, the second resonant frequency is a resonant frequency that is around double the switching frequency, the fourth resonant frequency is a resonant frequency that is around four times the switching frequency, and the impedance has local maxima at the first resonant frequency and the third resonant frequency and local minima at the second resonant frequency and the fourth resonant frequency.

Here, the second LC resonance circuit internally includes a first inductance, a second inductance, a third inductance, a first capacitance, and a second capacitance, the first inductance, the second inductance, and the third inductance are connected in order in series between one DC input terminal out of the two DC input terminals and one end out of the two ends of the switch, another DC input terminal out of the two DC input terminals is directly connected to another end out of the two ends of the switch, the first capacitance is connected between a junction between the first inductance and the second inductance and the other end of the switch, and the second capacitance is connected in parallel to the second inductance.

Alternatively, the second LC resonance circuit internally may include a fourth inductance, a fifth inductance, a sixth inductance, a third capacitance, and a fourth capacitance, the fourth inductance, the fifth inductance, and the sixth inductance are connected in order in series between one DC input terminal out of the two DC input terminals and one end out of the two ends of the switch, another DC input terminal out of the two DC input terminals is directly connected to another end out of the two ends of the switch, the third capacitance is connected between a junction between the fourth inductance and the fifth inductance and the other end of the switch, and the fourth capacitance is connected between a junction between the fifth inductance and the sixth inductance and the other end of the switch.

Alternatively, the second LC resonance circuit internally may include a seventh inductance, an eighth inductance, a ninth inductance, a fifth capacitance, and a sixth capacitance, the seventh inductance, the fifth capacitance, and the eighth inductance are connected in order in series between one DC input terminal out of the two DC input terminals and one end out of the two ends of the switch, another DC input terminal out of the two DC input terminals is directly connected to another end out of the two ends of the switch, the ninth inductance is connected in parallel to a series circuit composed of the seventh inductance and the fifth capacitance, and the sixth capacitance is connected between a junction between the seventh inductance and the fifth capacitance and the other end of the switch.

Alternatively, the second LC resonance circuit internally may include a tenth inductance, an eleventh inductance, a twelfth inductance, a seventh capacitance, and an eighth capacitance, a series circuit, which is composed of the tenth inductance and the seventh capacitance, and the eleventh inductance are connected in order in series between one DC input terminal out of the two DC input terminals and one end out of the two ends of the switch, another DC input terminal out of the two DC input terminals is directly connected to another end out of the two ends of the switch, the twelfth inductance is connected in parallel to the series circuit, and the eighth capacitance is connected between a junction between the series circuit and the eleventh inductance and the other end of the switch.

The power converter according to the present invention has a construction where the switch performs a Class E switching operation.

In the power converter according to the present invention, the second LC resonance circuit internally includes inductances that are magnetically coupled.

In the power converter according to the present invention, the capacitance and the inductance included in the first LC resonance circuit are composed of a ninth capacitance and a thirteenth inductance that are disposed so as to be distributed between a first path between one end of the switch and one AC output terminal out of the two AC output terminals and a second path between another end of the switch and another AC output terminal out of the two AC output terminals.

The power converter according to the present invention further comprises an AC-to-DC converter circuit that includes a third LC resonance circuit and a rectifier circuit, is connected across the AC output terminals, converts the AC voltage outputted from the AC output terminals to a DC voltage, and outputs the DC voltage.

According to the present invention, in a power converter, such as a resonant inverter or a resonant convertor, a second LC resonance circuit is connected between the two DC input terminals and both ends of the switch, and when looking from both ends of the switch when the two DC input terminals are shorted, the frequency characteristics of an impedance of the second LC resonance circuit include, in order from a low-frequency side to a high-frequency side, a first resonant frequency, a second resonant frequency, a third resonant frequency, and a fourth resonant frequency, the first resonant frequency is higher than a switching frequency of the switch, the second resonant frequency is a resonant frequency that is around double the switching frequency, the fourth resonant frequency is a resonant frequency that is around four times the switching frequency, and the impedance has local maxima at the first resonant frequency and the third resonant frequency and local minima at the second resonant frequency and the fourth resonant frequency. By doing so, since the peak value of the voltage waveform applied across both ends of the switch when the switch is off can be reduced, it is possible to use a switch with a low withstand voltage and therefore a low on-resistance. As a result, it is possible to provide a power converter that is highly efficient. Also, since it is possible to further reduce the peak value of the voltage waveform applied across the switch in this way, it is possible to reduce the voltage derating at the switch, which also improves the reliability of the switch.

It should be noted that the disclosure of the present invention relates to a content of Japanese Patent Application 2017-121883 that was filed on 22 Jun. 2017 and the entire content of which is herein incorporated by reference.

BRIEF DESCRIPTION OF THE DRAWINGS

These and other objects and features of the present invention will be explained in more detail below with reference to the attached drawings, wherein:

FIG. 7 is a waveform diagram useful in describing an operation of an inverter apparatus 1a;

DESCRIPTION OF THE PREFERRED EMBODIMENTS

Several preferred embodiments of the present invention will now be described. Note that the present invention is not limited to the following embodiments. The component elements described below include equivalent component elements that should be apparent to those of skill in the art, and such component elements may be combined as appropriate.

Preferred embodiments of the present invention will now be described in detail with reference to the drawings. Note that in the description of the drawings, elements that are the same have been assigned the same reference numerals and duplicated description thereof is omitted.

First, the overall configuration of a power converter according to a preferred embodiment of the present invention will be described with reference to FIG. 1, with an inverter apparatus 1a as one example of a power converter. The inverter apparatus 1a is equipped with a load network 4 and a switch 5.

The inverter apparatus 1a is also equipped with a pair of DC input terminals 2a and 2b (hereinafter collectively referred to as the "DC input terminals 2" when no distinction is made) and a pair of AC output terminals 3a and 3b (hereinafter collectively referred to as the "AC output terminals 3" when no distinction is made).

In more detail, the DC input voltage (DC voltage) V1 is inputted across the pair of DC input terminals 2a and 2b, with the DC input terminal 2b, which is connected to a reference potential (in the present embodiment, the common ground G), as the low-potential side. An AC output voltage (AC voltage) V2 is outputted across the pair of AC output terminals 3a and 3b, with the AC output terminal 3b connected to the reference potential (in the present embodiment, the common ground G) as a reference and the potential of an AC output terminal 3a changing between positive and negative. A load resistance 6 is connected to the inverter apparatus 1a.

Here, the load resistance 6 is connected across the AC output terminals 3a and 3b and the AC output voltage V2 produced by converting the DC input voltage V1 inputted into the DC input terminals 2 is supplied to the load resistance 6.

The switch 5 is constructed of a MOSFET, a bipolar transistor, or the like. This means that both ends of the switch 5, described later, are the drain electrode and source electrode of a MOSFET, or the collector electrode and emitter electrode of a bipolar transistor. Due to the switch 5 switching on and off, the inverter apparatus 1a converts the DC input voltage V1 inputted from the DC input terminals 2 to the AC output voltage V2 and outputs the AC output voltage V2 from the AC output terminals 3.

The load network 4 includes a second LC resonance circuit 41 with optimized impedance characteristics Z, a first resonant capacitance 42 (which includes the output capacitance of the switch 5), and a first LC resonance circuit 43, and is a load that is responsive to on/off switching of the switch 5.

The second LC resonance circuit 41 is constructed by a network with two terminal pairs (i.e., a four-terminal network) composed of four external connection terminals, i.e., a first connector 41a, a second connector 41b, a third connector 41c, and a fourth connector 41d. Note that the second LC resonance circuit 41 may be a composite resonant impedance element as a single electronic component that is a three-terminal element or a four-terminal element constructed by integrating an inductance and a capacitance that are internally provided.

The second LC resonance circuit 41 is connected between the pair of DC input terminals 2a and 2b and both ends of the switch 5, with for example, the first connector 41a connected to one DC input terminal (in the present embodiment, the DC input terminal 2a) out of the pair of DC input terminals 2a and 2b, the second connector 41b connected to the other DC input terminal (in the present embodiment, the DC input terminal 2b) out of the pair of DC input terminals 2a and 2b, the third connector 41c connected to one end out of the two ends of the switch 5, and the fourth connector 41d connected to the other end out of the two ends of the switch 5. Also, by connecting (or "directly connecting", that is, connecting directly using a wire, a conductive pattern, or the like) the second connector 41b and the fourth connector 41d in the internal circuitry of the second LC resonance circuit 41 so that the second connector 41b and the fourth connector 41d become the same potential, the connectors 41b and 41d are both connected to the common ground G. Accordingly, it is also possible to use a configuration where the connectors 41b and 41d are a single connector.

Figure 2:
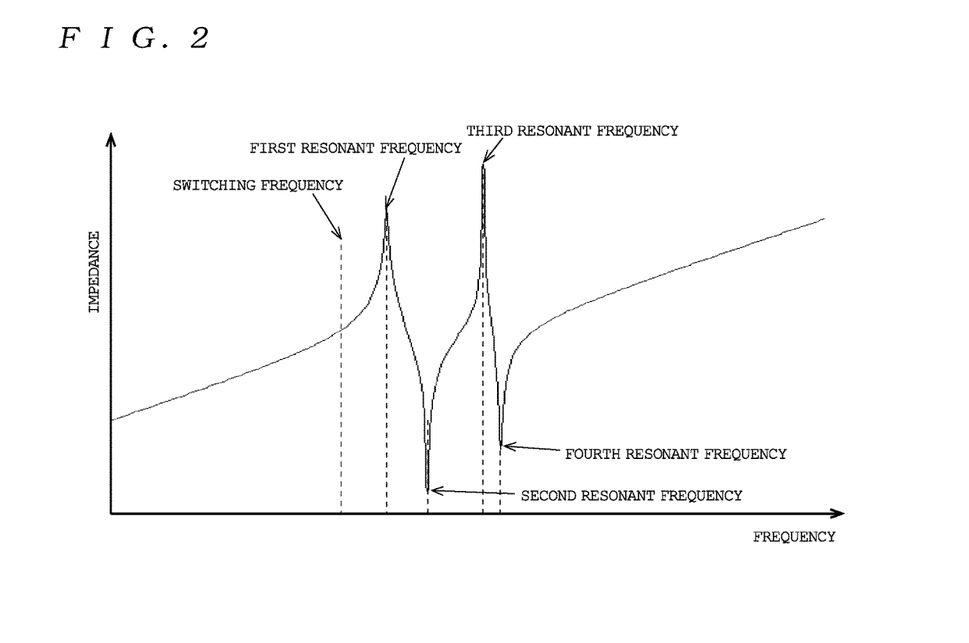
FIG. 2 is a block diagram useful in explaining frequency characteristics, which include four resonant frequencies, of a second LC resonance circuit 41 with optimized impedance characteristics Z according to the present invention.

The second LC resonance circuit 41 is formed so as to have optimized impedance characteristics Z like those depicted in FIG. 2 as the frequency characteristics of the impedance seen from both ends of the switch 5 (that is, the impedance between the two connectors 41c and 41d) when the two DC input terminals 2a and 2b are shorted (for example, when the output impedance of a power supply, not illustrated, that outputs the DC input voltage V1 across the DC input terminals 2a and 2b is a low impedance, or in other words, when the equivalent of a short circuit is produced between the DC input terminals 2a and 2b).

In more detail, as depicted in FIG. 2, these frequency characteristics (or "the optimized impedance characteristics Z") of the second LC resonance circuit 41 include, in order from the low-frequency side to the high-frequency side, a first resonant frequency, a second resonant frequency, a third resonant frequency, and a fourth resonant frequency. The first resonant frequency is higher than the switching frequency of the switch 5, the second resonant frequency is around double the switching frequency, and the fourth resonant frequency is around four times the switching frequency. The impedance has local maxima at the first resonant frequency and the third resonant frequency and has local minima at the second resonant frequency and the fourth resonant frequency.

Figure 8:
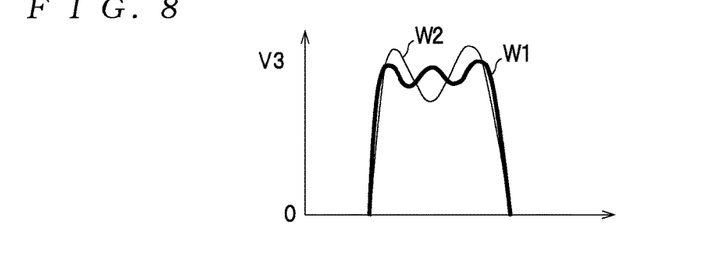
FIG. 8 is a schematic diagram useful in describing a voltage waveform of a voltage V3 in FIG. 7.

Although a voltage V3 with the same frequency as the switching frequency is generated across both ends of the switch 5 during the off period, as described above the impedance of the second LC resonance circuit 41 has local minima at even-numbered multiples of (in the example described above, double and four times) the switching frequency, and as a result, even-numbered components (in the example described above, the second harmonic component and the fourth harmonic component) out of the harmonic components that construct the voltage V3 generated across both ends of the switch 5 are attenuated by the second LC resonance circuit 41. On the other hand, as described above, the second LC resonance circuit 41 has local maxima at the first resonant frequency and the third resonant frequency, and due to this, odd-numbered components (mainly the third harmonic component) out of the harmonic components that construct the voltage V3 are not attenuated in the same way as the base frequency component (the first harmonic component), and so remain. As a result, as depicted in FIG. 8, compared to a waveform W2 where only the second harmonic component is attenuated (that is a waveform composed of the base frequency component and the third and fourth harmonic components), the waveform W1 of the voltage V3 whose second harmonic component and fourth harmonic component are attenuated (i.e., a waveform formed of the base frequency component and the third harmonic component) rises and falls more suddenly and has a suppressed amplitude of vibration in a center part, producing a shape that is closer to a rectangular waveform. Accordingly, the voltage peak value is suppressed more than the waveform W2 whose voltage peak value is suppressed to around double the DC input voltage V1. For this reason, in the inverter apparatus 1a, a switch with a low withstand voltage and therefore a low on-resistance is used as the switch 5. Also in the inverter apparatus 1a, since it is possible to further suppress the voltage peak value applied across both ends of the switch 5 in this way, it is possible to reduce the voltage derating at the switch 5, which improves the reliability of the switch 5.

Next, specific examples of detailed circuit configurations of the second LC resonance circuit 41 with the optimized impedance characteristics Z will be described with reference to FIGS. 3 to 6.

Figure 3:
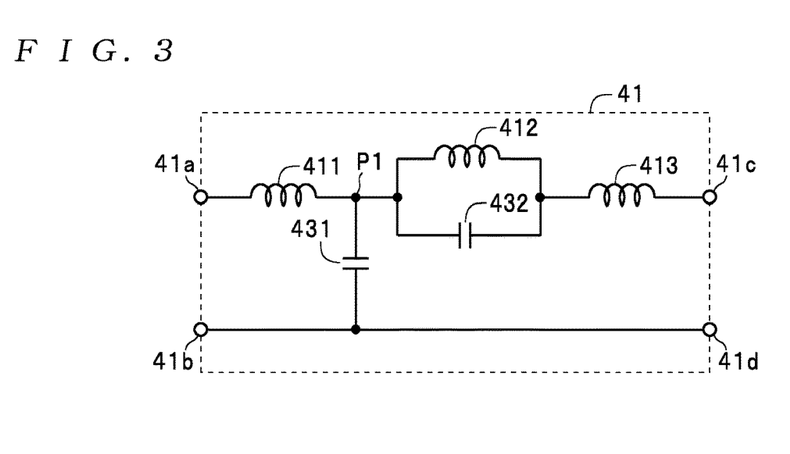
FIG. 3 is a circuit diagram depicting a first circuit configuration of the second LC resonance circuit 41 with the optimized impedance characteristics Z in FIG. 2.

FIG. 3 is a first specific example of the second LC resonance circuit 41. This second LC resonance circuit 41 is configured to internally include a first inductance 411, a second inductance 412, a third inductance 413, a first capacitance 431, and a second capacitance 432. The first inductance 411, the second inductance 412, and the third inductance 413 are connected in that order in series between the first connector 41a (i.e., the connector connected to one DC input terminal 2a out of the DC input terminals 2a and 2b) and the third connector 41c (i.e., the connector connected to one out of the two ends of the switch 5). The second connector 41b (i.e., the connector connected to the other DC input terminal 2b out of the DC input terminals 2a and 2b) and the fourth connector 41d (i.e., the connector connected to the other end out of the two ends of the switch 5) are directly connected. The first capacitance 431 is connected between a junction P1 between the first inductance 411 and the second inductance 412 and the fourth connector 41d that is connected as described above to the other end of the switch 5. The second capacitance 432 is connected in parallel to the second inductance 412.

Figure 4:
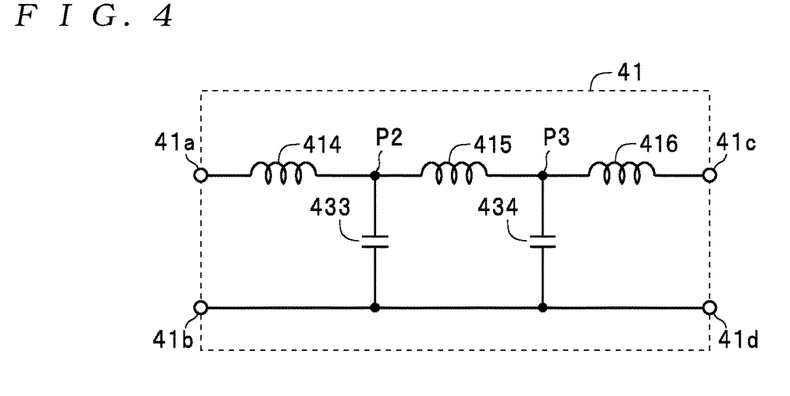
FIG. 4 is a circuit diagram depicting a second circuit configuration of the second LC resonance circuit 41 with the optimized impedance characteristics Z in FIG. 2.

FIG. 4 is a second specific example of the second LC resonance circuit 41. This second LC resonance circuit 41 is configured to internally include a fourth inductance 414, a fifth inductance 415, a sixth inductance 416, a third capacitance 433, and a fourth capacitance 434. The fourth inductance 414, the fifth inductance 415, and the sixth inductance 416 are connected in that order in series between the first connector 41a and the third connector 41c. The second connector 41b and the fourth connector 41d are directly connected. The third capacitance 433 is connected between a junction P2 between the fourth inductance 414 and the fifth inductance 415 and the fourth connector 41d. The fourth capacitance 434 is connected between a junction P3 between the fifth inductance 415 and the sixth inductance 416 and the fourth connector 41d.

Figure 5:
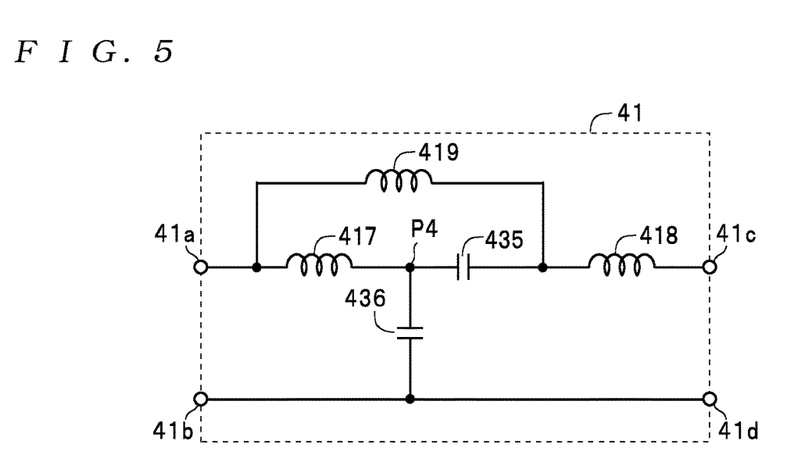
FIG. 5 is a circuit diagram depicting a third circuit configuration of the second LC resonance circuit 41 with the optimized impedance characteristics Z in FIG. 2.

FIG. 5 is a third specific example of the second LC resonance circuit 41. This second LC resonance circuit 41 is configured to internally include a seventh inductance 417, an eighth inductance 418, a ninth inductance 419, a fifth capacitance 435, and a sixth capacitance 436. The seventh inductance 417, the fifth capacitance 435, and the eighth inductance 418 are connected in series in that order between the first connector 41a and the third connector 41c. The second connector 41b and the fourth connector 41d are directly connected. The ninth inductance 419 is connected in parallel to a series circuit composed of the seventh inductance 417 and the fifth capacitance 435. The sixth capacitance 436 is connected between a junction P4 between the seventh inductance 417 and the fifth capacitance 435 and the fourth connector 41d.

Figure 6:
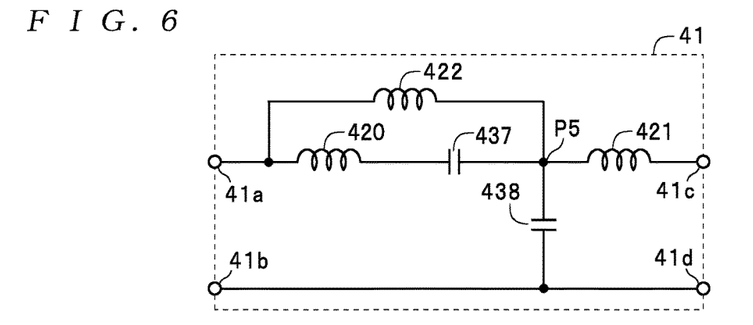
FIG. 6 is a circuit diagram depicting a fourth circuit configuration of the second LC resonance circuit 41 with the optimized impedance characteristics Z in FIG. 2.

FIG. 6 is a fourth specific example of the second LC resonance circuit 41. This second LC resonance circuit 41 is configured to internally include a tenth inductance 420, an eleventh inductance 421, a twelfth inductance 422, a seventh capacitance 437, and an eighth capacitance 438. A series circuit, which is composed of the tenth inductance 420 and the seventh capacitance 437, and the eleventh inductance 421 are connected in series in that order between the first connector 41a and the third connector 41c. Note that the series circuit composed of the tenth inductance 420 and the seventh capacitance 437 is not limited to the configuration depicted in FIG. 6 (i.e., a configuration where the tenth inductance 420 is disposed on the first connector 41a-side) and although not illustrated, it should be obvious that the positions of the tenth inductance 420 and the seventh capacitance 437 may be interchanged. The second connector 41b and the fourth connector 41d are directly connected. The twelfth inductance 422 is connected in parallel to the series circuit described above. The eighth capacitance 438 is connected between a junction P5 between the series circuit described above and the eleventh inductance 421 and the fourth connector 41d.

The plurality of inductors provided inside the second LC resonance circuit 41 may include inductors that are magnetically coupled. As one example, for the example circuit in FIG. 3, at least two out of the first inductance 411, the second inductance 412, and the third inductance 413 may be composed of inductors that are magnetically coupled to each other. By doing so, a second LC resonance circuit that has a simple circuit configuration and has four resonant frequencies (the first resonant frequency to the fourth resonant frequency) is realized and at the same time the number of magnetic cores is reduced, which facilitates manufacturing at low cost and optimization. When there are fluctuations in the core characteristics of the inductor cores, it is also possible to suppress differences in fluctuations in the element characteristics of individual inductors, which contributes to stabilization of operations.

By using this configuration, when the switch 5 is on, a DC current loop composed of the DC input terminal 2a→the interior of the second LC resonance circuit 41 (the first connector 41a→the third connector 41c)→the switch 5→the interior of the second LC resonance circuit 41 (the fourth connector 41d→the second connector 41b)→the DC input terminal 2b is formed. On the other hand, when the switch 5 is off, a current path (current loop) that passes via the DC input terminal 2a→the interior of the second LC resonance circuit 41 (the first connector 41a→the third connector 41c)→the first resonant capacitance 42→the interior of the second LC resonance circuit 41 (the fourth connector 41d→the second connector 41b) back to the DC input terminal 2b is formed together with another current path (current loop) that passes via the DC input terminal 2a→the interior of the second LC resonance circuit 41 (the first connector 41a→the second connector 41b via the first capacitance 431 or the like) back to the DC input terminal 2b.

Figure 1:
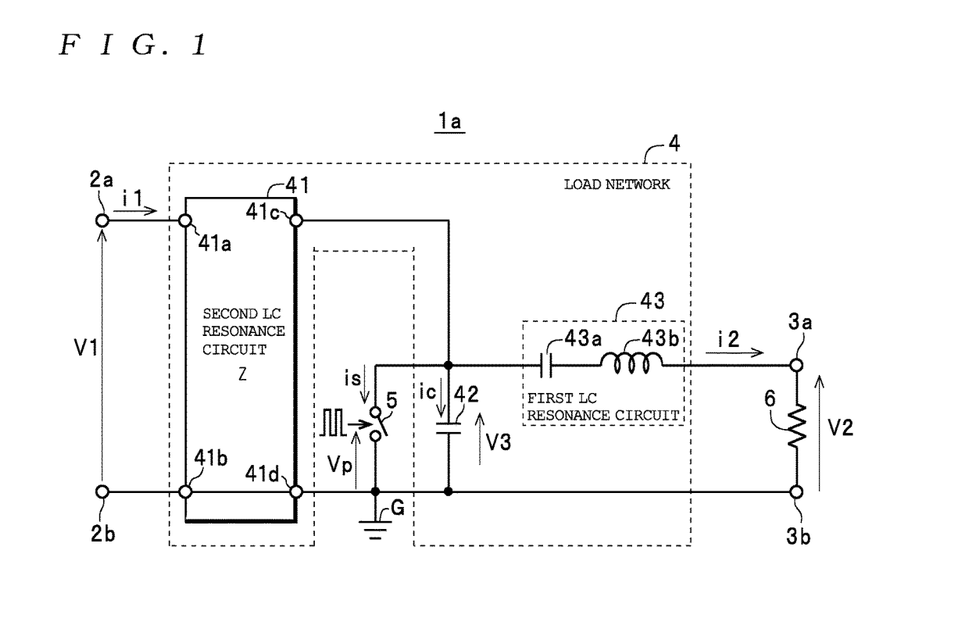
FIG. 1 is a block diagram schematically depicting the circuit configuration of an inverter apparatus 1a as a power converter according to a first embodiment of the present invention.

Although as depicted in FIG. 1, the first resonant capacitance 42 is a resonant capacitance for resonant switching that is connected to both ends of the switch 5, when the switch 5 is a semiconductor element, the first resonant capacitance 42 may include the capacitance of junctions provided in the switch 5 and may be composed of only the capacitance of such junctions.

As one example, as depicted in FIG. 1, the first LC resonance circuit 43 is configured to include a capacitance 43a and an inductance 43b. In this example, the capacitance 43a and the inductance 43b are connected in series on a path that connects both ends of the switch 5 and the AC output terminals 3a and 3b to each other (in FIG. 1, an AC current loop, described later, formed by both a path that connects one end of the switch 5 and the AC output terminal 3a and a path that connects the other end of the switch 5 and the AC output terminal 3b).

As one example, in the inverter apparatus 1a in FIG. 1, the first LC resonance circuit 43 is composed of a series circuit with the capacitance 43a and the inductance 43b that are directly connected to one another and is connected on a path that connects one end of the switch 5 and the AC output terminal 3a. As one example in FIG. 1, the first LC resonance circuit 43 is connected on this path in a state where one end of the capacitance 43a that constructs the series circuit is connected to one end of the switch 5 and one end of the inductance 43b is connected to the AC output terminal 3a. By doing so, the other end of the switch 5 and the AC output terminal 3b are directly connected.

With this configuration, when the switch 5 is on, an AC current loop composed of the AC output terminal 3a↔the first LC resonance circuit 43↔the switch 5↔the AC output terminal 3b is formed. In FIG. 1, the AC output loop described above is produced since the first LC resonance circuit 43 composed of the series circuit described above is connected to the AC output terminal 3a, but it is also possible for the first LC resonance circuit 43 to be connected on the path that connects the other end of the switch 5 and the AC output terminal 3b and in this case, the AC current loop is composed of the AC output terminal 3a↔the switch 5↔the first LC resonance circuit 43↔the AC output terminal 3b. It is sufficient for the capacitance 43a and the inductance 43b that construct the first LC resonance circuit 43 to be connected in series on this AC current loop, and in place of a configuration where the capacitance 43a and the inductance 43b are connected to the path in a directly interconnected state (where the capacitance 43a and the inductance 43b are directly connected) as described above, it is also possible to use a configuration where the capacitance 43a and the inductance 43b are connected (disposed) so as to be distributed between the path (first path) that connects one end of the switch 5 and the AC output terminal 3a and the path (second path) that connects the other end of the switch 5 and the AC output terminal 3b.

Figure 7:
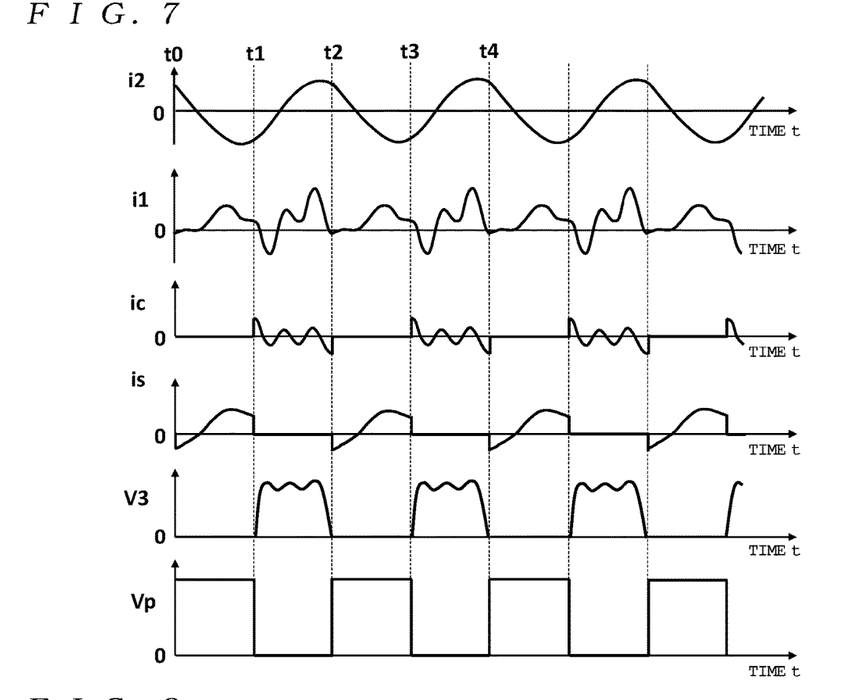

Next, the fundamental operation of the inverter apparatus 1a depicted in FIG. 1 will be described in detail for the operation waveforms in each period with reference to a steady-state operation waveform diagram given in FIG. 7.

Out of the operation waveforms in each period, the operations in the period from time t0 to time t1 are described first. At time t=t0, a driving signal voltage Vp outputted from a control circuit, not illustrated, that performs on/off control of the switch 5 becomes a high level to turn the switch 5 on and maintains this high level until time t=t1. Accordingly, in the period from time t0 to time t1, the switch 5 is on, the voltage V3 applied across both ends of the switch 5 is zero, and a current is that flows to the first resonant capacitance 42 is zero. Due to the characteristics of the load network 4, the current is that flows in the switch 5 falls from zero to a negative value and then gradually rises through zero to reach a positive peak value. The current it that flows in the second LC resonance circuit 41 that has the optimized impedance characteristics Z as the input current is a resonant current, and therefore has one positive resonant peak. On the other hand, the output current i2 in this period is a positive and negative sinusoidal current on both sides of zero that has a negative peak value in this period (t0 to t1).

Next, the operation in the period from time t1 to time t2 in FIG. 7 will be described. The driving signal voltage Vp supplied to the switch 5 at time t=t1 becomes a low level to turn off the switch 5, and this low level is maintained until time t=t2. Accordingly, the switch 5 is off during the period from time t1 to time t2 and, due to the characteristics of the load network 4, the voltage V3 applied across both ends of the switch 5 immediately after the switch 5 is turned off resonates and gradually rises from zero to a voltage with an amplitude that is around double the DC input voltage V1 and then falls to return to zero at time t=t2 via five resonant peaks (the first resonant peak that is a local maximum, the second resonant peak that is a local minimum, the third resonant peak that is a local maximum, the fourth resonant peak that is a local minimum, and the fifth resonant peak that is a local maximum), so that the derivative with respect to time (i.e., the rate of change in voltage with respect to time)

also becomes zero. In other words, the switch 5 performs a Class E switching operation with high efficiency. Here, as described above, the voltage V3 has the waveform W1 depicted in FIG. 8 (a waveform in which the voltage value is further suppressed (a waveform that is close to a rectangular waveform)).

By turning off the switch 5 during this period, the current is that flowed in the switch 5 up to this time becomes zero, and there is a switch to the current is flowing in the first resonant capacitance 42. As the input current, the current it that flows in the second LC resonance circuit 41 that has the optimized impedance characteristics Z is a resonant current with four resonant peaks (the first negative resonant peak that is a local minimum, the second positive resonant peak that is a local maximum, the third negative resonant peak that is a local minimum, and the fourth positive resonant peak that is a local maximum). On the other hand, the output current i2 rises immediately after reaching a negative peak value in the previous period (t0 to t1). The output current i2 is a positive and negative sinusoidal current on both sides of zero, resonates in this period (t1 to t2), and has a positive peak value.

The operation in the following period (t2 to t3) is the same as the operation in the period (t0 to t1) described earlier, and the operation in the next following period (t3 to t4) is the same as the operation in the period (t1 to t2) described earlier. That is, the operation during the period (t0 to t2) is repeated during the following periods.

In this way, with the inverter apparatus 1a, by outputting the driving signal voltage Vp to the switch 5 to repeatedly switch the switch 5 on and off, it is possible to convert the DC input voltage V1 to the AC output voltage V2. Here, by using the second LC resonance circuit 41 with the optimized impedance characteristics Z, it is possible to cause attenuation in the even-numbered components (in the examples described above, the second harmonic component and the fourth harmonic component) out of the harmonic components that construct the waveform of the voltage V3 applied across both ends of the switch 5 when the switch 5 is off. This means that the peak voltage (the peak voltage value of the voltage V3) applied across both ends of the switch 5 when the switch 5 is off can be made even lower than around double the amplitude of the DC input voltage V1. As a result, it is possible to lower the withstand voltage of the switch used as the switch 5, which makes it possible to select a switch with a low on-resistance. As a result, it is possible to achieve a reduction in the conduction loss (or "on loss") of the switch 5 and to further increase the conversion efficiency of the power converter. Also, since it is possible to reduce voltage derating at the switch 5, it is possible to improve the reliability of the switch 5. By using the second LC resonance circuit 41, it also becomes easier to optimize high-frequency switching operations.

An example where the on-off times of the driving signal voltage Vp used for on/off control of the switch 5 are equal has been described above. When the on time and the off time of the switch 5 differ, there are cases where the operation voltages and operation current peak times of the various components will also differ.

Figure 9:
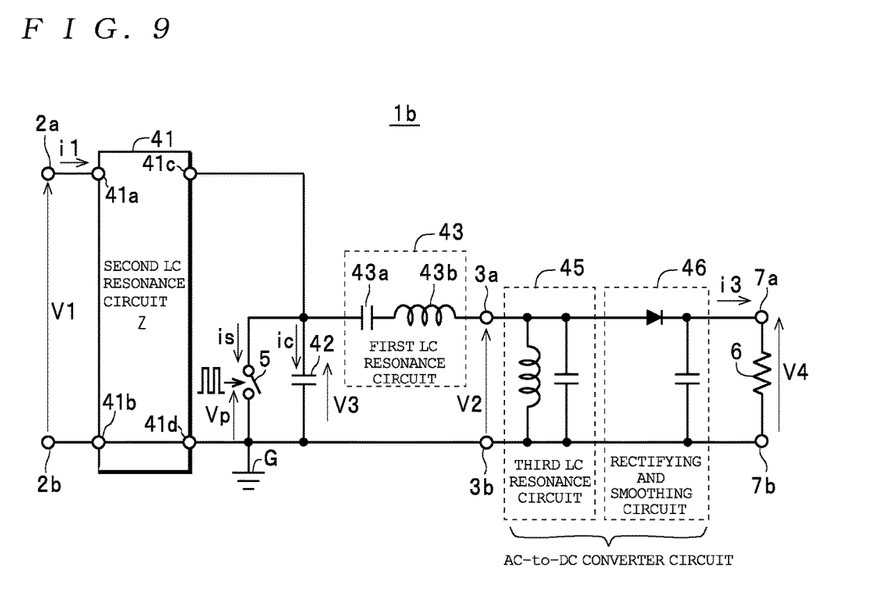
FIG. 9 is a diagram schematically depicting the circuit configuration of a converter apparatus 1b as a power converter according to a second embodiment of the present invention.

Also, an embodiment that uses the second LC resonance circuit 41 with the optimized impedance characteristics Z is not limited to the inverter apparatus 1a depicted in FIG. 1 (an example of an inverter circuit capable of converting an inputted DC voltage to an AC voltage) and it is also possible for example to apply the present invention to a converter apparatus 1b depicted in FIG. 9 (one example of a power converter that converts an input DC voltage to an output DC voltage).

A converter apparatus 1b in FIG. 9 is configured by additionally connecting, to the AC output terminals 3a and 3b of the inverter apparatus 1a in FIG. 1, an AC-to-DC converting circuit (i.e., a converter circuit equipped with a third LC resonance circuit 45, which includes a capacitance and an inductance, and a rectifying and smoothing circuit 46, which includes a rectifier and a smoother) that converts the AC output voltage V2 outputted from the AC output terminals 3a and 3b to a DC output voltage V4 and outputs the DC output voltage V4 from DC output terminals 7a and 7b. The minus-side DC input terminal 2b and the minus-side DC output terminal 7b are connected to the common ground G. The rest of the configuration is the same as in FIG. 1. The third LC resonance circuit 45 is configured by connecting a capacitance and an inductance in parallel, and the rectifying and smoothing circuit 46 is configured by connecting a rectifier, such as a diode, including a junction capacitance, and a smoother, such as a capacitor, in series. The DC output voltage V4 is outputted from the rectifying and smoothing circuit 46 (more specifically, from the DC output terminals 7a and 7b that are connected to the two terminals of the smoother of the rectifying and smoothing circuit 46). By doing so, when a load resistance 6 is connected to the DC output terminals 7a and 7b, the DC output voltage V4 is supplied to the load resistance 6. Also, the output current i3 in FIG. 9 is not an AC sine wave, but a DC current with a ripple component.

Note that a converter as a power converter is not limited to the configuration of the converter 1b described above, and it is also possible to configure step-down, step-up, and step-up/step-down converters by combining the first LC resonance circuit 41, the third LC resonance circuit 45, and the rectifying and smoothing circuit 46. By using a configuration where an insulating transformer is inserted in front of the rectifying and smoothing circuit 46, it is possible to construct a converter where an input DC voltage and an output DC voltage are insulated from each other.

Although the power converter according to the present invention has been described above by way of various embodiments, the present invention is not limited to the embodiments described above and various modifications are also possible. As one example, although embodiments with a fundamental configuration where the DC input terminal 2b and an output terminal (the AC output terminal 3b or the DC output terminal 7b) are connected to the common ground G as depicted in FIGS. 1 and 9 by directly connecting the second connector 41b and the fourth connector 41d in the specific examples of the second LC resonance circuit 41 depicted in FIGS. 3 to 6 have been described, it is also possible to use a configuration where the ground is not common (that is, a configuration where the second connector 41b and the fourth connector 41d are not directly connected and one out of the DC input terminal 2b and the output terminal (the AC output terminal 3b or the DC output terminal 7b) is not connected to the common ground G).

This second LC resonance circuit 41 configured so that the second connector 41b and the fourth connector 41d are not directly connected refers to an LC resonance circuit where, any of the specific examples of the second LC resonance circuit 41 depicted in FIGS. 3 to 6, the first connector 41a and the second connector 41b have been interchanged and the third connector 41c and the fourth connector 41d have been interchanged. With a second LC resonance circuit of this configuration, although the DC input terminal 2a and one end of the switch 5 are directly connected, an inductance and/or a capacitance (for the example of the circuit in FIG. 3, the first inductance 411, the second inductance 412, the third inductance 413, and the second capacitance 432) are connected between the DC input terminal 2b and the other end of the switch 5, resulting in a configuration where one out of the DC input terminal 2b and an output terminal (i.e., the AC output terminal 3b or the DC output terminal 7b) is not connected to the common ground G.

Configurations where one of the DC input terminal 2b and an output terminal (i.e., the AC output terminal 3b or the DC output terminal 7b) is not connected to the common ground G also include, as described above, a configuration where the capacitance 43a and the inductance 43b that construct the first LC resonance circuit 43 are disposed so as to be distributed between a first path that connects one end of the switch 5 and the AC output terminal 3a and a second path that connects the other end of the switch 5 and the AC output terminal 3b.

Moreover, the invention encompasses any possible combination of some or all of the various embodiments and the modification examples described herein and incorporated herein.

It is possible to achieve at least the following configurations from the above-described example embodiments and the modification examples of the disclosure.

(1) A power converter comprising:
two direct current (DC) input terminals that are plus and minus and into which a DC voltage is inputted;
two alternating current (AC) output terminals that output an AC voltage;
a switch with two ends;
a first resonant capacitance connected between both ends of the switch;
a first LC resonance circuit that is connected in series together with the switch between the AC output terminals; and
a second LC resonance circuit that is connected between the two DC input terminals and both ends of the switch,
wherein the first LC resonance circuit includes a current path including a series circuit composed of an inductance and a capacitance, and
when looking from both ends of the switch when the two DC input terminals are shorted, frequency characteristics of an impedance of the second LC resonance circuit include, in order from a low-frequency side to a high-frequency side, a first resonant frequency, a second resonant frequency, a third resonant frequency, and a fourth resonant frequency, the first resonant frequency is higher than a switching frequency of the switch, the second resonant frequency is a resonant frequency that is around double the switching frequency, the fourth resonant frequency is a resonant frequency that is around four times the switching frequency, and the impedance has local maxima at the first resonant frequency and the third resonant frequency and local minima at the second resonant frequency and the fourth resonant frequency.

(2) The power converter according to (1),
wherein the second LC resonance circuit internally includes a first inductance, a second inductance, a third inductance, a first capacitance, and a second capacitance,
the first inductance, the second inductance, and the third inductance are connected in order in series between one DC input terminal out of the two DC input terminals and one end out of the two ends of the switch,
another DC input terminal out of the two DC input terminals is directly connected to another end out of the two ends of the switch,
the first capacitance is connected between a junction between the first inductance and the second inductance and the other end of the switch, and
the second capacitance is connected in parallel to the second inductance.

(3) The power converter according to (1),
wherein the second LC resonance circuit internally includes a fourth inductance, a fifth inductance, a sixth inductance, a third capacitance, and a fourth capacitance,
the fourth inductance, the fifth inductance, and the sixth inductance are connected in order in series between one DC input terminal out of the two DC input terminals and one end out of the two ends of the switch,
another DC input terminal out of the two DC input terminals is directly connected to another end out of the two ends of the switch,
the third capacitance is connected between a junction between the fourth inductance and the fifth inductance and the other end of the switch, and
the fourth capacitance is connected between a junction between the fifth inductance and the sixth inductance and the other end of the switch.

(4) The power converter according to (1),
wherein the second LC resonance circuit internally includes a seventh inductance, an eighth inductance, a ninth inductance, a fifth capacitance, and a sixth capacitance,
the seventh inductance, the fifth capacitance, and the eighth inductance are connected in order in series between one DC input terminal out of the two DC input terminals and one end out of the two ends of the switch,
another DC input terminal out of the two DC input terminals is directly connected to another end out of the two ends of the switch,
the ninth inductance is connected in parallel to a series circuit composed of the seventh inductance and the fifth capacitance, and
the sixth capacitance is connected between a junction between the seventh inductance and the fifth capacitance and the other end of the switch.

(5) The power converter according to (1),
wherein the second LC resonance circuit internally includes a tenth inductance, an eleventh inductance, a twelfth inductance, a seventh capacitance, and an eighth capacitance,
a series circuit, which is composed of the tenth inductance and the seventh capacitance, and the eleventh inductance are connected in order in series between one DC input terminal out of the two DC input terminals and one end out of the two ends of the switch,
another DC input terminal out of the two DC input terminals is directly connected to another end out of the two ends of the switch,
the twelfth inductance is connected in parallel to the series circuit, and
the eighth capacitance is connected between a junction between the series circuit and the eleventh inductance and the other end of the switch.

(6) The power converter according to any one of (1) to (5),
wherein the switch performs a Class E switching operation.

(7) The power converter according to any one of (1) to (6),
wherein the second LC resonance circuit internally includes inductances that are magnetically coupled.

(8) The power converter according to any one of (1) to (7), wherein the capacitance and the inductance included in the first LC resonance circuit are composed of a ninth capacitance and a thirteenth inductance that are disposed so as to be distributed between a first path between one end of the switch and one AC output terminal out of the two AC output terminals and a second path between another end of the switch and another AC output terminal out of the two AC output terminals.

(9) The power converter according to any one of (1) to (8), further comprising an AC-to-DC converter circuit that includes a third LC resonance circuit and a rectifier circuit, is connected across the AC output terminals, converts the AC voltage outputted from the AC output terminals to a DC voltage, and outputs the DC voltage.

What is claimed is:

1. A power converter comprising:
   two direct current (DC) input terminals that are plus and minus and into which a DC voltage is inputted;
   two alternating current (AC) output terminals that output an AC voltage;
   a switch with two ends;
   a first resonant capacitance connected between both ends of the switch;
   a first LC resonance circuit that is connected in series together with the switch between the AC output terminals; and
   a second LC resonance circuit that is connected between the two DC input terminals and both ends of the switch,
   wherein the first LC resonance circuit includes a current path including a series circuit composed of an inductance and a capacitance, and
   when looking from both ends of the switch when the two DC input terminals are shorted, frequency characteristics of an impedance of the second LC resonance circuit include, in order from a low-frequency side to a high-frequency side, a first resonant frequency, a second resonant frequency, a third resonant frequency, and a fourth resonant frequency, the first resonant frequency is higher than a switching frequency of the switch, the second resonant frequency is a resonant frequency that is around double the switching frequency, the fourth resonant frequency is a resonant frequency that is around four times the switching frequency, and the impedance has local maxima at the first resonant frequency and the third resonant frequency and local minima at the second resonant frequency and the fourth resonant frequency.

2. The power converter according to claim 1,
   wherein the second LC resonance circuit internally includes a first inductance, a second inductance, a third inductance, a first capacitance, and a second capacitance,
   the first inductance, the second inductance, and the third inductance are connected in order in series between one DC input terminal out of the two DC input terminals and one end out of the two ends of the switch,
   another DC input terminal out of the two DC input terminals is directly connected to another end out of the two ends of the switch,
   the first capacitance is connected between a junction between the first inductance and the second inductance and the other end of the switch, and
   the second capacitance is connected in parallel to the second inductance.

3. The power converter according to claim 1,
   wherein the second LC resonance circuit internally includes a fourth inductance, a fifth inductance, a sixth inductance, a third capacitance, and a fourth capacitance,
   the fourth inductance, the fifth inductance, and the sixth inductance are connected in order in series between one DC input terminal out of the two DC input terminals and one end out of the two ends of the switch,
   another DC input terminal out of the two DC input terminals is directly connected to another end out of the two ends of the switch,
   the third capacitance is connected between a junction between the fourth inductance and the fifth inductance and the other end of the switch, and
   the fourth capacitance is connected between a junction between the fifth inductance and the sixth inductance and the other end of the switch.

4. The power converter according to claim 1,
   wherein the second LC resonance circuit internally includes a seventh inductance, an eighth inductance, a ninth inductance, a fifth capacitance, and a sixth capacitance,
   the seventh inductance, the fifth capacitance, and the eighth inductance are connected in order in series between one DC input terminal out of the two DC input terminals and one end out of the two ends of the switch,
   another DC input terminal out of the two DC input terminals is directly connected to another end out of the two ends of the switch,
   the ninth inductance is connected in parallel to a series circuit composed of the seventh inductance and the fifth capacitance, and
   the sixth capacitance is connected between a junction between the seventh inductance and the fifth capacitance and the other end of the switch.

5. The power converter according to claim 1,
   wherein the second LC resonance circuit internally includes a tenth inductance, an eleventh inductance, a twelfth inductance, a seventh capacitance, and an eighth capacitance,
   a series circuit, which is composed of the tenth inductance and the seventh capacitance, and the eleventh inductance are connected in order in series between one DC input terminal out of the two DC input terminals and one end out of the two ends of the switch,
   another DC input terminal out of the two DC input terminals is directly connected to another end out of the two ends of the switch,
   the twelfth inductance is connected in parallel to the series circuit, and
   the eighth capacitance is connected between a junction between the series circuit and the eleventh inductance and the other end of the switch.

6. The power converter according to claim 1,
   wherein the switch performs a Class E switching operation.

7. The power converter according to claim 1,
   wherein the second LC resonance circuit internally includes inductances that are magnetically coupled.

8. The power converter according to claim 1,
   wherein the capacitance and the inductance included in the first LC resonance circuit are composed of a ninth capacitance and a thirteenth inductance that are disposed so as to be distributed between a first path between one end of the switch and one AC output terminal out of the two AC output terminals and a second path between another end of the switch and another AC output terminal out of the two AC output terminals.

9. The power converter according to claim 1, further comprising an AC-to-DC converter circuit that includes a third LC resonance circuit and a rectifier circuit, is connected across the AC output terminals, converts the AC voltage outputted from the AC output terminals to a DC voltage, and outputs the DC voltage.

* * * * *